United States Patent
Schwindt et al.

(10) Patent No.: US 10,978,750 B2
(45) Date of Patent: Apr. 13, 2021

(54) ELECTRICAL CONNECTOR FOR A BATTERY MODULE

(71) Applicant: Robert Bosch GmbH, Stuttgart (DE)

(72) Inventors: Emilia Schwindt, Stuttgart (DE);
Carsten Mueller, Stuttgart (DE);
Stefan Baumann, Altenriet (DE);
Andreas Ruehle, Beitigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 497 days.

(21) Appl. No.: 15/321,740

(22) PCT Filed: Jun. 1, 2015

(86) PCT No.: PCT/EP2015/062119
§ 371 (c)(1),
(2) Date: Dec. 22, 2016

(87) PCT Pub. No.: WO2015/197311
PCT Pub. Date: Dec. 30, 2015

(65) Prior Publication Data
US 2017/0133725 A1 May 11, 2017

(30) Foreign Application Priority Data

Jun. 26, 2014 (DE) .................... 10 2014 212 247.3

(51) Int. Cl.
*H01M 10/42* (2006.01)
*H05K 1/18* (2006.01)
(Continued)

(52) U.S. Cl.
CPC ......... *H01M 10/425* (2013.01); *H01M 2/206* (2013.01); *H01M 10/052* (2013.01);
(Continued)

(58) Field of Classification Search
CPC .................... H01M 10/425; H01M 10/48–482
See application file for complete search history.

(56) References Cited

U.S. PATENT DOCUMENTS 4,884,335 A * 12/1989 McCoy .................... H05K 3/34
29/839
2007/0187807 A1 * 8/2007 Lee ...................... H01L 23/3107
257/676
(Continued)

FOREIGN PATENT DOCUMENTS

CN 100596257 C * 3/2010
DE 102009036086 A1 * 2/2011 .......... H01M 10/425
(Continued)

OTHER PUBLICATIONS

Machine Translation provided by Google Patents of DE102009036086A1 originally published Feb. 17, 2011 to Abraham et al.*
(Continued)

*Primary Examiner* — Jonathan Crepeau
(74) *Attorney, Agent, or Firm* — Michael Best & Friedrich LLP

(57) ABSTRACT

Disclosed is a battery module comprising at least one battery cell and a cell monitoring unit which is connected in an electrically conducting manner to a flexible circuit board by at least one bonding wire and/or at least one bonding strip.

17 Claims, 1 Drawing Sheet

(51) Int. Cl.
*H01M 10/48* (2006.01)
*H01M 2/20* (2006.01)
*H01M 10/052* (2010.01)
*H01M 12/06* (2006.01)

(52) U.S. Cl.
CPC ......... *H01M 10/482* (2013.01); *H01M 12/06* (2013.01); *H05K 1/189* (2013.01); *H01L 2224/48091* (2013.01); *H01L 2924/19107* (2013.01); *H01M 2010/4271* (2013.01); *H01M 2010/4278* (2013.01); *H05K 2201/10037* (2013.01)

(56) References Cited

U.S. PATENT DOCUMENTS

| | | | | |
|---|---|---|---|---|
| 2008/0241667 | A1* | 10/2008 | Kohn | H01M 2/1016 429/159 |
| 2009/0117458 | A1 | 5/2009 | Yun | |
| 2011/0274952 | A1 | 11/2011 | Itagaki et al. | |
| 2013/0244499 | A1 | 9/2013 | Heck et al. | |
| 2013/0252032 | A1* | 9/2013 | Zhao | H01M 2/1077 429/7 |
| 2014/0017533 | A1 | 1/2014 | Nishihara et al. | |
| 2014/0363704 | A1* | 12/2014 | Bachmann | H01M 10/48 429/7 |
| 2015/0364740 | A1* | 12/2015 | De Arroyabe | B23K 20/005 429/90 |

FOREIGN PATENT DOCUMENTS

| | | | |
|---|---|---|---|
| DE | 102011078548 A1 | 1/2012 | |
| DE | 102011016373 | 10/2012 | |
| DE | 102012212368 | 1/2013 | |
| DE | 102011081964 | 3/2013 | |
| DE | 102012205020 | 10/2013 | |
| EP | 1577689 A1 * | 9/2005 | H01R 4/028 |

OTHER PUBLICATIONS

Certified Human Translation of DE102009036086 originally published to Abraham et al. in 2009.*
Google Patents machine translation of CN100596257 originally published to Xianwei et al in 2010.*
International Search Report for Application No. PCT/EP2015/062119 dated Jul. 30, 2015 (English Translation, 3 pages).

* cited by examiner

ELECTRICAL CONNECTOR FOR A BATTERY MODULE

BACKGROUND OF THE INVENTION

The invention relates to an electrical connector for a battery module.

Electrical connectors which electrically conductively connect at least one battery cell of a battery module to a detection unit, for example by welding electrically conductive wires to the battery cell and the detection unit, are known from the prior art.

A disadvantage of the known prior art is the fact that various production steps are necessary in order to produce and assemble an electrically conductive connection between a battery cell and a detection unit. An electrical connector is produced, by way of example, from electrically conductive wires, wherein the wires must have an exact length and must be able to bend. Each electrical connector is welded or adhesively bonded to at least one battery cell and a detection unit. The electrically conductive wires are then combined to form a cable harness.

SUMMARY OF THE INVENTION

The approach according to the invention, by contrast, has the advantage that a cell monitoring unit is electrically conductively connected to a flexible circuit board by means of at least one bonding wire and/or at least one bonding strip.

Aluminum, aluminum-silicon, copper, or gold is advantageously used as material for the bonding wire and/or the bonding strip in order to reduce line losses. The bonding wire and/or the bonding strip can further advantageously be produced by means of roll bonding, for example by applying a copper layer to an aluminum layer, wherein this connection is mechanically non-detachable.

Depending on a specific energy density, for example 200 Wh/kg, and a number of battery cells of the battery module in question, the bonding wire advantageously has a diameter between 100 µm and 500 µm, such that a maximum current flow of, for example, 20 A through the bonding wire is ensured without the bonding wire becoming damaged, for example.

Depending on a specific energy density, for example 240 Wh/kg, and a number of battery cells of the battery module in question, the bonding strip advantageously has a rectangular cross-section with a width between 30 µm and 3000 µm and a height between 10 µm and 500 µm, such that a maximum current flow of, for example, 80 A through the bonding strip is ensured without the bonding strip becoming damaged, for example.

The bonding wire and/or the bonding strip advantageously have/has a length between 1 mm and 30 mm, such that a mechanical stability is ensured and low line resistances are achieved.

The cell monitoring unit advantageously comprises at least one voltage sensor, a current sensor, a temperature sensor, a resistor and/or a battery management system, such that a voltage of individual battery cells is detected by the cell monitoring unit, for example.

The cell monitoring unit is advantageously arranged within a region of the flexible circuit board, and the cell monitoring unit and the flexible circuit board are adhesively bonded, screwed, soldered or welded to one another and/or mechanically connected to one another by means of locking mechanisms, whereby a particularly high strength is achieved and a failure rate, for example on account of vibrations, is reduced.

The flexible circuit board advantageously comprises, as base material, PET (polyester), PEM (polyethylene naphthalate) and/or PI (polyimide), wherein conductive tracks are applied to the base material by means of printing methods or lithography.

In order to produce an electrically conductive connection between the bonding wire and/or the bonding strip and a bus bar, a conductive track and/or a contact face, various method variants are used, such as thermocompression bonding (TC bonding), thermosonic ball-wedge bonding (TS bonding) and/or ultrasonic wedge-wedge bonding (US bonding).

These methods are selected for example on the basis of the used material of the bonding wires or of the bonding strip. TC bonding is thus used rarely for wire bonding since the high forces and temperatures necessary to produce a connection may damage the connection elements, whereas the method is suitable however for strip bonding. If gold or copper is used as material for the bonding wires or bonding strips, TS bonding is suitable. If, by contrast, aluminum or aluminum-silicon is used as material for the bonding wires or bonding strips, US bonding is advantageously suitable.

A space-optimized arrangement of battery cells is advantageously possible on account of the smaller spatial requirement of the flexible circuit board, the cell monitoring unit, and the bonding wires and/or bonding strips compared to previously used cable harnesses.

A new geometry and/or a new arrangement of battery cells is advantageously possible on account of the mechanical flexibility of the bonding wires and/or the bonding strips as cell connectors. New geometries can be advantageously implemented at bonding machines with few changes required.

With use of flexible circuit boards, cell monitoring units, bonding wires and/or bonding strips, a repair of defective electrical connections is advantageously possible with comparatively low outlay compared to previous connection techniques.

Fewer production steps are advantageously possible for the contacting of battery cells and the connection means by bonding wires and/or bonding strips, whereby a lower technical outlay is necessary for a production process of battery modules and a higher degree of automation is made possible.

The battery module is advantageously used in a lithium-ion, a lithium-sulfur and/or a lithium-air battery.

BRIEF DESCRIPTION OF THE DRAWINGS

Exemplary embodiments of the invention are illustrated in the drawings and will be explained in greater detail in the following description.

In the drawings.

DETAILED DESCRIPTION

Like reference signs designate like device components in all drawings.

Figure 1:
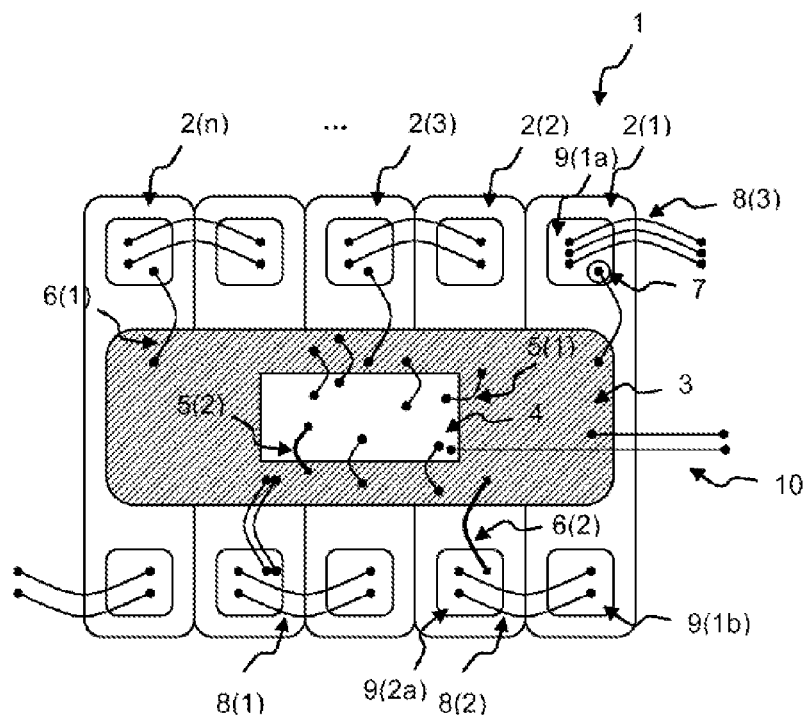
FIG. 1 shows an embodiment of the battery module according to the invention.

FIG. 1 shows a battery module 1 having a plurality of battery cells 2(1), 2(2), 2(3), 2(n), wherein each battery cell 2(1), 2(2), 2(3), 2(n) has at least two cell terminals 9(1a), 9(1b), 9(2a).

By way of example, the cell terminal 9(1a) in FIG. 1 is mechanically and electrically conductively connected to a positive pole of the battery cell 2(1), and the cell terminal 9(1b) is mechanically and electrically conductively connected to a negative pole of the battery cell 2(1). Cell terminals of different polarity are electrically conductively connected to one another by means of at least one cell connector 8(1), 8(2), 8(3), for example the cell terminal 9(1b) of the battery cell 2(1) is connected to the cell terminal 9(2a) of the battery cell 2(2). The cell connectors 8(1), 8(2), 8(3) are embodied as bonding wires and/or bonding strips.

In accordance with the invention the battery module 1 comprises a flexible circuit board 3 and a cell monitoring unit 4. In the embodiment shown in FIG. 1 the cell monitoring unit 4 is arranged within a region of the flexible circuit board 3, and the flexible circuit board 3 and the cell monitoring unit 4 are adhesively bonded to one another.

In alternative embodiments a mechanical connection is established between the flexible circuit board 3 and the cell monitoring unit 4 by screwing, soldering and/or welding.

In a further embodiment the cell monitoring unit 4 is realized directly on the flexible circuit board 3 by means of electronic components, whereby a rigid circuit board of the cell monitoring unit 4 is advantageously spared.

In a further embodiment the flexible circuit board 3 and/or the cell monitoring unit 4 has a locking device so that, by way of example, the cell monitoring unit 4 is reversibly mechanically connected to the flexible circuit board 3 and is advantageously swapped in the event of a defect.

The flexible circuit board 3 in the shown embodiment comprises bus bars and/or devices for balancing the charge of the battery cells 2(1), 2(2), 2(3), 2(n). The cell terminals 9(1a), 9(1b), 9(2a) are electrically conductively connected to the flexible circuit board 4, for example to the bus bars, conductive tracks, contact faces and/or the devices for charge balancing, by means of a least one bonding wire 6(1) and/or bonding strip 6(2). In the shown embodiment a temperature sensor 7 is advantageously connected to the flexible circuit board 3.

The cell monitoring unit 4 comprises at least one voltage sensor, a current sensor, a temperature sensor, a resistor and/or a battery management system in order to determine battery module properties for the battery module 1 such as a state of charge (SOC), state of health (SOH) and internal resistance. The cell monitoring unit 4 is electrically conductively connected to the flexible circuit board 3 by means of at least one bonding wire 5(1) and/or a bonding strip 5(2) and by way of example can detect a voltage of an individual battery cell 2(1), 2(2), 2(3), 2(n) or all battery cells 2(1), 2(2), 2(3), 2(n) by means of the voltage sensor.

The reliability of battery modules 1 can advantageously be increased by the cell monitoring unit, since defects can be identified early on, such that safety measures can be taken even before a defect occurs and, for example, individual batteries 2(1), 2(2), 2(3), 2(n) can be switched on or off.

In a further embodiment the cell monitoring unit 4 and/or the flexible circuit board 3 are connected by means of electrically conductive connections and/or optical connections to further cell monitoring units 4, flexible circuit boards 3 and/or battery management systems, for example by means of a cable connection and/or by means of a bus system.

A central battery management system advantageously detects battery module properties of a number of battery modules 1 in order to determine battery properties on the basis of the battery module properties.

Figure 2:
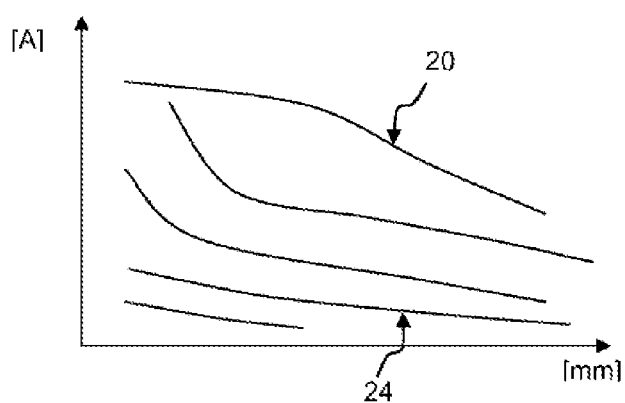
FIG. 2 shows a graph of the exemplary current carrying capacity as a function of the diameter of a bonding wire.

In FIG. 2 a current carrying capacity (in amperes) of a bonding wire diameter to bonding wire length ratio is plotted over a length of a bonding wire (in millimeters). On the basis of the illustrated curves, the diameter can be selected depending on a necessary current capacity of the bonding wire, such that a weight reduction is achieved as a result of a lower material requirement and a reduction of having at least one battery cell transition resistances. By way of example, the current carrying capacity for bonding wires 20 and 24 made of aluminum and having a diameter of 500 µm and 200 µm respectively is illustrated in FIG. 2

If a particularly high demand is placed on a mechanical stability of a bonding connection of the bonding wire, for example on account of a high ambient temperature of the battery module 1 or due to strong vibrations, a larger diameter of the bonding wire is selected, such that a tear-off value with a diameter of the bonding wire of 200 µm is 500 cN, for example.

The invention claimed is:

1. A battery module (1) having multiple battery cells (2(1), 2(2), 2(3), 2(n)), each battery cell having at least two cell terminals, wherein one of the cell terminals of each of the battery cells is electrically conductively connected to a cell terminal of different polarity of an adjacent one of the battery cells by at least one cell connector, wherein the battery module (1) comprises a cell monitoring unit (4), characterized in that the cell monitoring unit (4) is electrically conductively connected to a flexible circuit board (3) by means of at least one bonding wire (5(1)) and/or at least one bonding strip (5(2)), wherein a top surface of the flexible circuit board is connected to a top surface of the cell monitoring unit by the at least one bonding wire (5(1)) and/or the at least one bonding strip (5(2)) to facilitate replacement of the cell monitoring unit, wherein the cell monitoring unit is reversibly mechanically connected to the flexible circuit board, and wherein the at least one cell connector is implemented as bonding wires and/or bonding strips.

2. The battery module (1) as claimed in claim 1, characterized in that aluminum, aluminum-silicon, copper and/or gold is used as material for the bonding wire (5(1)) and/or the bonding strip (5(2)).

3. The battery module (1) as claimed in claim 1, characterized in that the bonding wire (5(1)) has a diameter between 100 µm and 500 µm.

4. The battery module (1) as claimed in claim 1, characterized in that the bonding strip (5(2)) has a rectangular shape with a width between 30 µm and 3000 µm and a height between 10 µm and 500 µm.

5. The battery module (1) as claimed in claim 1, characterized in that the bonding wire (5(1)) and/or the bonding strip (5(2)) have/has a length between 1 mm and 30 mm.

6. The battery module (1) as claimed in claim 1, characterized in that the cell monitoring unit (4) comprises at least one voltage sensor, a current sensor, a temperature sensor, a resistor and/or a battery management system.

7. The battery module (1) as claimed in claim 1, characterized in that the cell monitoring unit (4) is arranged within a region of the flexible circuit board (3), and the cell monitoring unit (4) and the flexible circuit board (3) are screwed to one another.

8. The battery module (1) as claimed in claim 1, characterized in that the flexible circuit board (3) comprises, as base material, PET (polyester), PEM (polyethylene naphthalate) and/or PI (polyimide).

9. A method for producing an electrically conductive connection as claimed in claim 1, characterized in that an electrically conductive connection is produced between the cell monitoring unit (4) and the flexible circuit board (3) by means of thermosonic ball-wedge bonding, ultrasonic wedge-wedge bonding and/or thermocompression bonding of at least one bonding wire (5(1)) and/or bonding strip (5(2)).

10. A battery that is lithium-ion, lithium-sulfur and/or lithium-air, comprising a battery module (1) as claimed in claim 1.

11. The battery as claimed in claim 10, characterized in that aluminum, aluminum-silicon, copper and/or gold is used as material for the bonding wire (5(1)) and/or the bonding strip (5(2)).

12. The battery as claimed in claim 10, characterized in that the bonding wire (5(1)) has a diameter between 100 μm and 500 μm.

13. The battery as claimed in claim 10, characterized in that the bonding strip (5(2)) has a rectangular shape with a width between 30 μm and 3000 μm and a height between 10 μm and 500 μm.

14. The battery as claimed in claim 10, characterized in that the bonding wire (5(1)) and/or the bonding strip (5(2)) have/has a length between 1 mm and 30 mm.

15. The battery as claimed in claim 10, characterized in that the cell monitoring unit (4) comprises at least one voltage sensor, a current sensor, a temperature sensor, a resistor and/or a battery management system.

16. The battery as claimed in claim 10, characterized in that the cell monitoring unit (4) is arranged within a region of the flexible circuit board (3), and the cell monitoring unit (4) and the flexible circuit board (3) are screwed to one another.

17. The battery as claimed in claim 10, characterized in that the flexible circuit board (3) comprises, as base material, PET (polyester), PEM (polyethylene naphthalate) and/or PI (polyimide).

\* \* \* \* \*